(12) United States Patent
Jeong

(10) Patent No.: US 7,771,900 B2
(45) Date of Patent: Aug. 10, 2010

(54) MANUFACTURING METHOD FOR PHOTO MASK

(75) Inventor: Goo Min Jeong, Cheongju-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 368 days.

(21) Appl. No.: 11/774,677

(22) Filed: Jul. 9, 2007

(65) Prior Publication Data

US 2008/0160430 A1 Jul. 3, 2008

(30) Foreign Application Priority Data

Dec. 29, 2006 (KR) .................... 10-2006-0138849

(51) Int. Cl.
G03F 1/00 (2006.01)
(52) U.S. Cl. ......................................................... 430/5
(58) Field of Classification Search .................... 430/5, 430/322, 323, 324, 394
See application file for complete search history.

(56) References Cited

U.S. PATENT DOCUMENTS

| 6,979,408 | B2 | 12/2005 | Tezuka et al. | |
| 7,001,697 | B2 * | 2/2006 | Park et al. | 430/5 |
| 7,005,215 | B2 * | 2/2006 | Pierrat | 430/5 |
| 7,014,958 | B2 | 3/2006 | Dalton et al. | |
| 7,014,959 | B2 | 3/2006 | Crawford et al. | |
| 7,060,400 | B2 | 6/2006 | Wang et al. | |
| 7,563,547 | B2 * | 7/2009 | Park et al. | 430/5 |
| 2003/0228047 | A1 * | 12/2003 | Chou et al. | 382/144 |

FOREIGN PATENT DOCUMENTS

| KP | 10-2006-0070356 | 6/2006 |
| KP | 10-2006-0133419 | 12/2006 |
| KR | 10-2006-0006357 | 1/2006 |

* cited by examiner

*Primary Examiner*—Stephen Rosasco
(74) *Attorney, Agent, or Firm*—Marshall, Gerstein & Borun LLP

(57) ABSTRACT

A method for manufacturing a photo mask includes forming a mask pattern over a transparent substrate; forming a photoresist over the transparent substrate; subjecting the photoresist to an exposure light from the rear of the transparent substrate to form a photoresist pattern on the mask pattern; and correcting a line width in the mask pattern using the photoresist pattern as a mask.

6 Claims, 4 Drawing Sheets

MANUFACTURING METHOD FOR PHOTO MASK

CROSS-REFERENCE TO RELATED APPLICATION

The present application claims priority to Korean patent application No. 10-2006-138849, filed on Dec. 29, 2006, which is incorporated by reference in its entirety.

BACKGROUND

This patent relates to a method for manufacturing a photo mask, and more particularly to a method for manufacturing a photo mask which can easily and effectively correct the line width of a mask pattern on the photo mask.

In general, various patterns of a semiconductor device are formed by photolithography technology including an exposure process and a development process using a photo mask.

However, during the process of manufacturing a photo mask, a critical dimension (CD) error or uniformity error may be exhibited in a mask pattern included in the photo mask due to various factors. Especially, a CD error in the mask pattern occurs when the mask pattern forms a line width larger or smaller than a desired line width. When the CD error in the mask pattern occurs, various patterns of a semiconductor device may have a line width different from the desired one, which may generate a error.

Therefore, such CD error in the mask pattern must be corrected, or if the correction is difficult the photo mask should be discarded.

Conventionally, when a CD error in the mask pattern was confirmed, via for example scanning electron microscope (SEM), the photo mask containing the CD error is to be discarded, and the conditions for manufacturing a photo mask, for example an electron beam exposure condition, were adjusted such as to re-manufacture a photo mask. Substantially, there is no way of using the photo mask with the CD error by correcting the line width in the mask pattern.

Therefore, the CD error effected as one factor for lowering production yield of photo masks. Moreover, even though the conditions for manufacturing the photo mask are adjusted, there is no way to confirm before hand whether or not the CD error will occur and such conditions are not easily adjusted, as a result the CD error also effected as a factor for lowering productivity and economical efficiency in the manufacturing method of a photo mask.

SUMMARY OF THE INVENTION

In accordance with one of the herein described embodiments, a method for manufacturing a photo mask may comprise: forming a mask pattern over a transparent substrate; forming a photoresist over the transparent substrate; subjecting the photoresist to an exposure light from the rear of the transparent substrate to form a photoresist pattern on the mask pattern; and correcting a line width in the mask pattern using the photoresist pattern as a mask.

In such a method, correcting a line width in the mask pattern may include etching the mask pattern using the photoresist pattern as a mask.

The mask pattern may include a phase shift film pattern, or a phase shift film pattern and a light shielding film pattern sequentially formed on the transparent substrate.

Herein, the phase shift film pattern maybe comprise a MoSiN film, the light shielding film pattern maybe comprise a chromium(Cr) film, and the transparent substrate maybe comprise quartz.

Furthermore, in the method correcting a line width in the mask pattern may include the correcting the mask pattern in regions divided on the transparent substrate in a separate manner.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

In accordance with one of the herein described embodiments, there is provided a method for manufacturing a photo mask comprising: forming a mask pattern on a transparent substrate; forming a photoresist on the transparent substrate; subjecting the photoresist to an exposure light from the rear of the transparent substrate to form a photoresist pattern on the mask pattern; and correcting a line width in the mask pattern using the photoresist pattern as a mask.

Figure 1A:
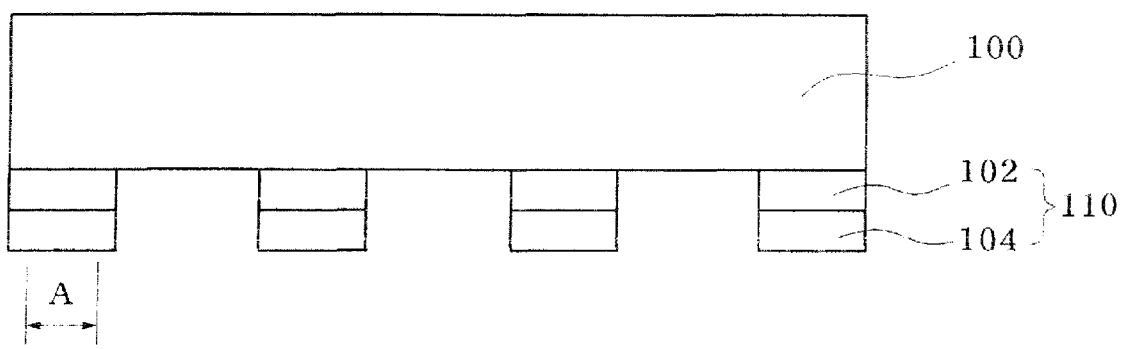
FIGS. 1A to 1E are simplified illustrations sequentially showing a method for manufacturing a photo mask according to one embodiment of the present invention.

First, referring to FIG. 1A, a mask pattern 110 may be formed on a transparent substrate 100 made of, for example quartz. The mask pattern 110 may include a phase shift film pattern 102 and a light shielding film pattern 104 sequentially formed on the transparent substrate 100. Alternatively, the mask pattern 110 may include only one of the phase shift film pattern and light shielding film pattern. Depending on the type of the mask pattern 110, a variety of photo masks, such as a binary mask or a phase shift mask, can be manufactured.

Meanwhile, the mask pattern 110 may be formed by sequentially forming a phase shift film made of, for example a MoSiN film having about 6% light transmittance, and a light shielding film made of, for example a chromium film, on the transparent substrate 100, forming a photoresist pattern on the light shielding film, and then etching the light shielding film and the phase shift film sequentially using the photoresist pattern as a mask.

Namely, in the case where the mask pattern 110 may include only one of a phase shift film pattern and light shielding film pattern, the mask pattern 110 may be formed by forming only one of the phase shift film made of a MoSiN film having about 6% of light transmittance and light shielding film made of a chromium film on the transparent substrate 100, forming a photoresist pattern on the phase shift film or the light shielding film, and then etching the phase shift film or the light shielding film using the photoresist pattern as a mask.

However, in a process of forming the mask pattern 110 on the transparent substrate 100 substantially in accordance with the above-described method, in some cases an error may occur in the condition of exposing electron beam for forming the photoresist pattern. Thus, a CD error in the mask pattern, in which the mask pattern 110 has a line width, "A", larger or smaller than a desired one, may be generated (FIG. 1A illustrates the case where a line width is formed larger than the desired line width "A" in the mask pattern 110).

Such a CD error in the mask pattern can be corrected by a method in accordance with an potential embodiment of the invention described below.

Figure 1B:
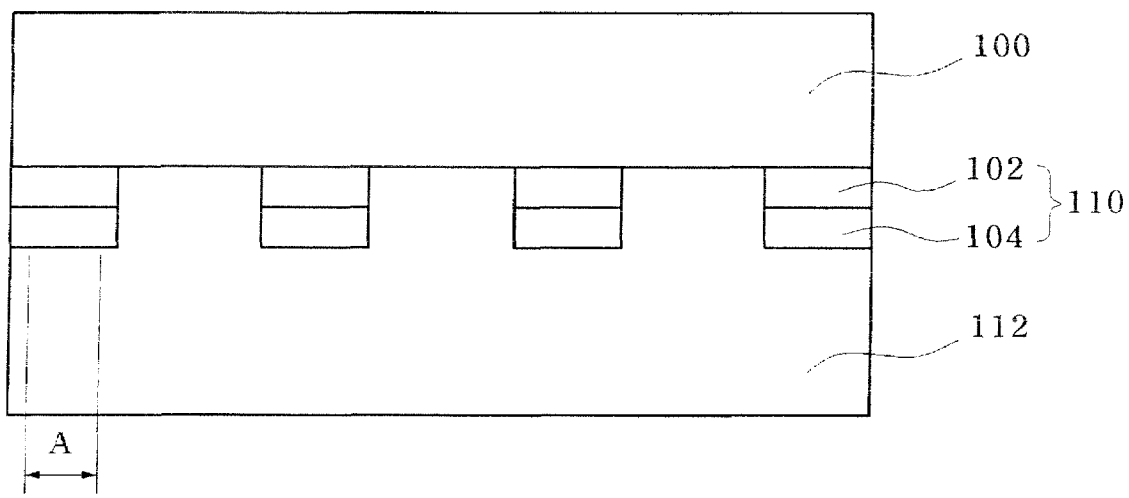

Referring to FIG. 1B, a photoresist 112 is formed on the transparent substrate 100, where the mask pattern 110 including the phase shift film pattern 102 and the light shielding film pattern 104 are formed.

Figure 1C:
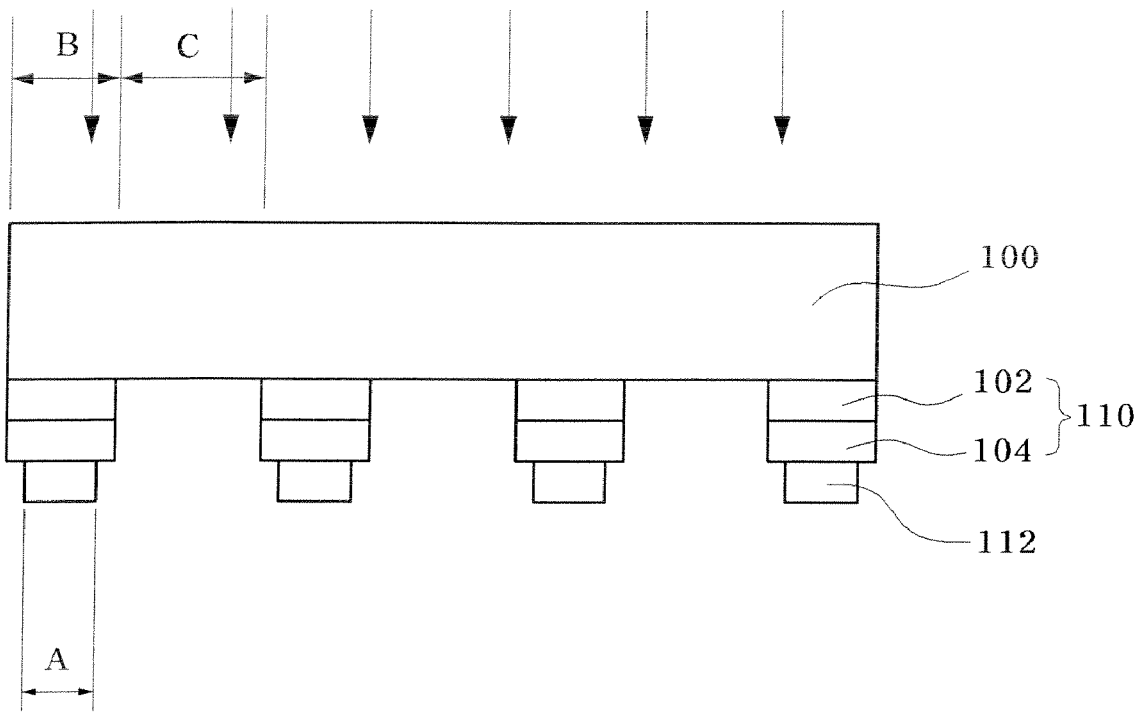
Figure 1D:
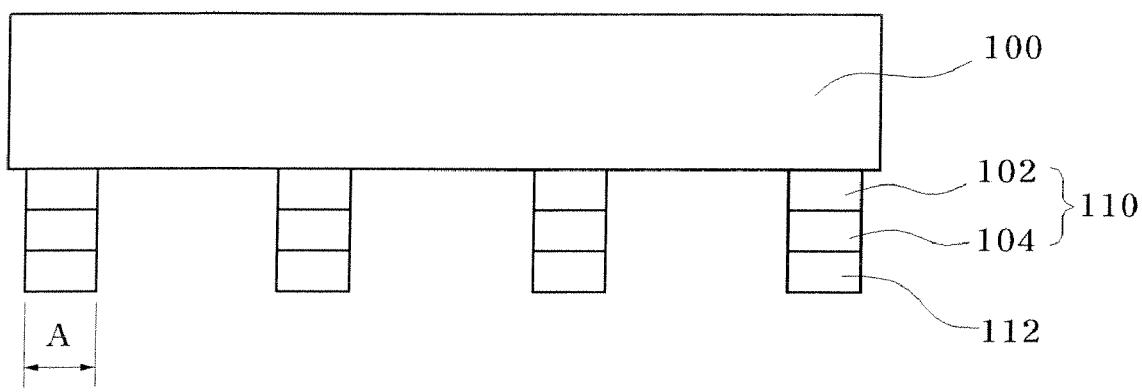

Subsequently, as illustrated in FIG. 1C, the photoresist 112 is subjected to an exposure light from the rear of the transparent substrate 100 and developed. When the rear exposure and development steps are carried out, the photoresist 112 is not exposed to light in the region "B" where the mask pattern is formed, since it is blocked by the phase shift film pattern 102 made of, for example a MoSiN film having about 6% of light transmittance or the light shielding film pattern 104 made of, for example a chromium film. Thus, the photoresist 112 remains on the mask pattern 110.

On the other hand, in the region "C" where the mask pattern 110 is not formed, the exposure and development for the photoresist 112 through the transparent substrate 100 exhibiting light transmission are accomplished so that the photoresist 112 can be removed.

Furthermore, the photoresist 112 on the mask pattern 110 may also be partially removed when the rear exposure is carried out in a predetermined exposure dose followed by the development step. As a result, the photoresist 112 can be formed in the line width "A" which is the desired line width in the mask pattern 110.

Figure 2:
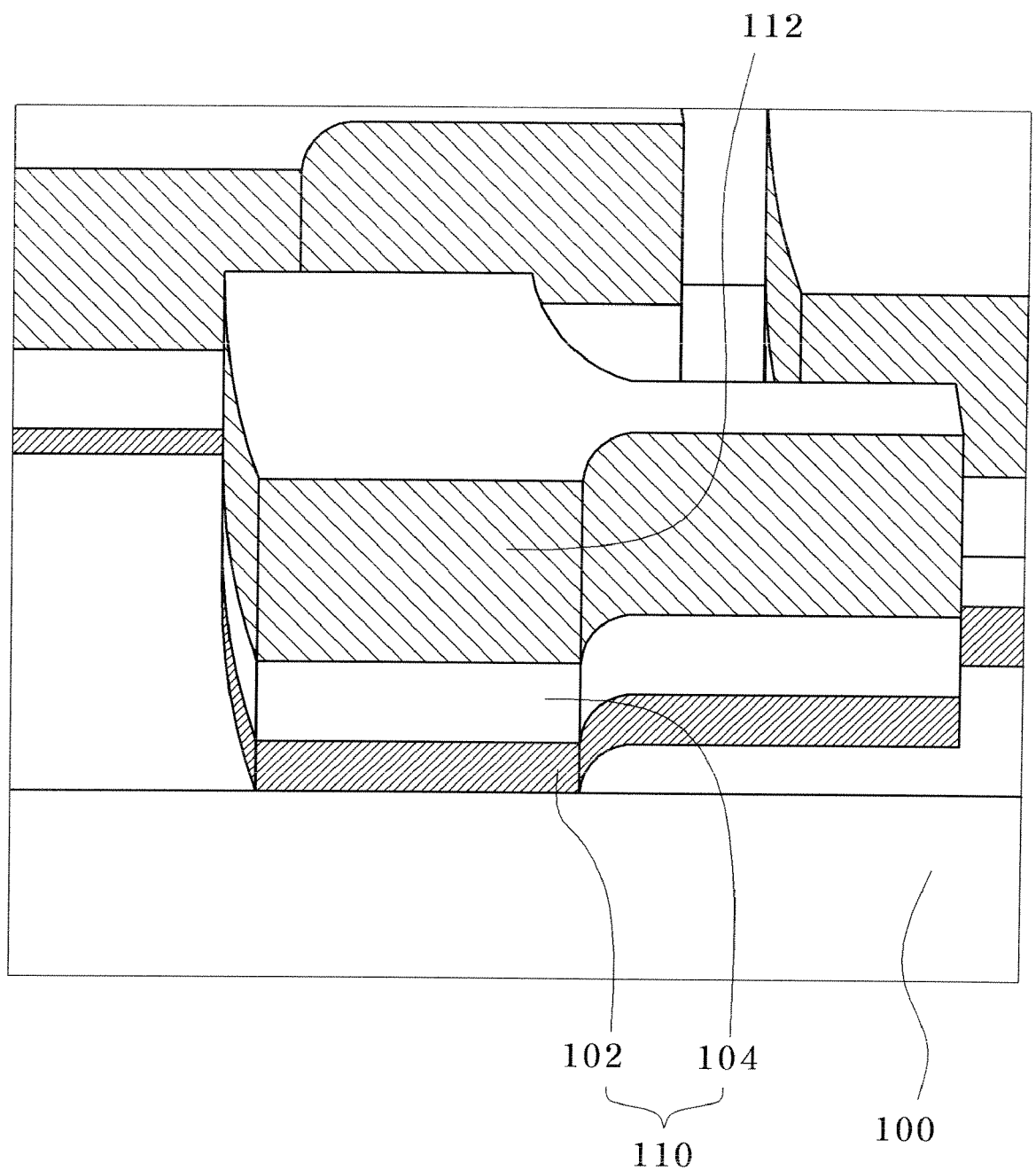
FIG. 2 is a SEM photograph showing the formation of a photoresist pattern on a mask pattern by the rear exposure step in FIG. 1C.

Consequently, the photoresist 112 remains on the mask pattern 110 with the line width "A", which is the desired line width in the mask pattern 110, when the rear exposure and development steps are carried out, and the photoresist 112 in the remaining regions are removed. In reference, FIG. 2 is a SEM photograph illustrating that the photoresist 112 remains only on the mask pattern 110 including the phase shift film pattern 102 and the light shielding film pattern 104 after carrying out rear exposure and development.

After carrying out rear exposure and development, the mask pattern 110 underneath the photoresist 112, which remains on the mask pattern 110 as a mask with a predetermined line width "A", that is the light shielding film pattern 104 and the phase shift film pattern 102, are etched and removed sequentially. As a result, the mask pattern is corrected to the predetermined line width "A," which is the desired line width in the mask pattern 110. Thus, the CD error can be corrected The case where the mask pattern 110 including the phase shift film pattern 102 and the light shielding film pattern 104 has been exemplified in the above, but the case where the mask pattern 110 including only one of the light shielding film pattern and phase shift film pattern may also correct the line width in the mask pattern 110 and the CD error by a method in accordance with the embodiments of the invention, such as the method as described above.

Figure 1E:
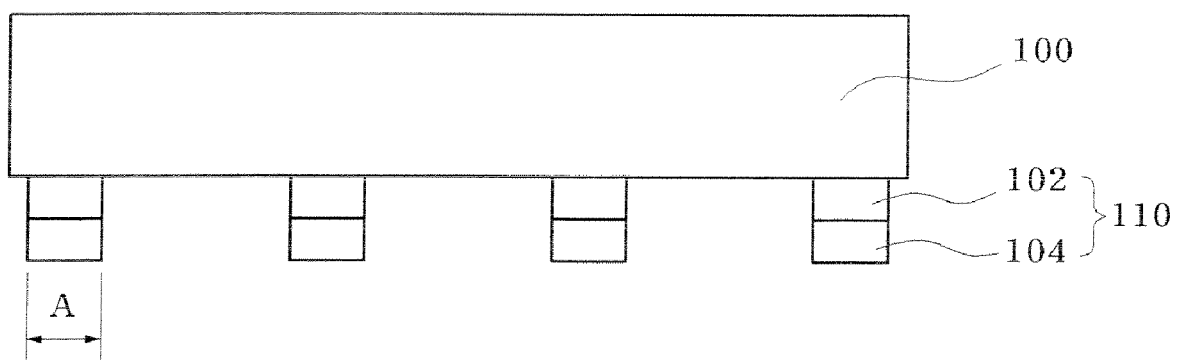

After correcting the CD error, the remaining photoresist 112 on the mask pattern 110 is removed as illustrated in FIG. 1E. As a result, a good photo mask which corrected the CD error in the mask pattern 110 can be manufactured.

That is, the line width of mask pattern and the CD error, which were difficult to be corrected conventionally, can be easily and effectively corrected according to the herein described methods in accordance with the invention. Therefore, the proportion of discarded photo masks including CD errors is reduced, and trial and error to re-manufacture a photo mask by adjusting the conditions for manufacturing a photo mask, for example the electron beam exposure condition and the like, can be reduced. Thus, yield, productivity, and economical efficiency in the process for manufacturing a photo mask can improve.

In the above-mentioned one embodiment, the case where the line width of a mask pattern which generated a CD error in a certain region of a transparent substrate, has been exemplified. However, according to a method for manufacturing a photo mask in another embodiment of the present invention, the line width of a mask pattern is corrected in each region on a transparent substrate in a separate manner such that the CD uniformity of the photo mask can improve even more.

For example, to some degree in the line width of the mask pattern to be corrected is determined in each region on the mask substrate, and accordingly the exposure dose to each region in the rear exposure is decided to prepare a mask map. Using the mask map, rear exposure may be carried out according to the different exposure dose in each region on the transparent substrate. Thereby, a photoresist on the mask pattern having different line width in each region is formed. Therefore, the CD uniformity of the photo mask can improve using the photoresist as a mask to correct the mask pattern in each region.

As described above, according to the above-mentioned method for manufacturing a photo mask, the CD error generated in the mask pattern of a photo mask can be corrected easily and effectively. Moreover, the line width of the mask pattern is corrected in each region on the transparent substrate in a separate manner such that the CD uniformity of a photo mask can improve.

Therefore, yield, productivity, economical efficiency, and the like in the process for manufacturing a photo mask can improve by applying the method for manufacturing a photo mask.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a photo mask comprising:
   forming a mask pattern over a first surface of a transparent substrate, wherein the transparent substrate has a first surface and a second surface opposite to each other;
   forming a positive photoresist over the first surface transparent substrate where the mask pattern is formed;
   irradiating an exposure light to the second surface of the substrate with a predetermined dose and developing the photoresist thereby forming a photoresist pattern having a desired line width on the mask pattern; and
   correcting a line width in the mask pattern using the photoresist pattern as a mask.

2. The method according to claim 1, wherein correcting a line width in the mask pattern comprises etching the mask pattern using the photoresist pattern as a mask.

3. The method according to claim 1, wherein the mask pattern comprises a phase shift film pattern.

4. The method according to claim 1, wherein the mask pattern comprises a phase shift film pattern and a light shielding film pattern formed on the transparent substrate.

5. The method according to claim 4, wherein the phase shift film pattern comprises a MoSiN film, the light shielding film pattern comprises chromium film, and the transparent substrate comprises quartz.

6. The method according to claim 1, wherein correcting a line width in the mask pattern comprises correcting the mask pattern in regions divided on the transparent substrate in a separate manner.

* * * * *